United States Patent [19]

Allerton et al.

[11] Patent Number: 4,667,154
[45] Date of Patent: May 19, 1987

[54] ELECTRICAL CONTACT ASSEMBLY

[75] Inventors: George L. Allerton, Orefield; Willard G. Otto, Schnecksville, both of Pa.

[73] Assignee: Lehighton Electronics, Inc., Lehighton, Pa.

[21] Appl. No.: 749,028

[22] Filed: Jun. 26, 1985

[51] Int. Cl.[4] .......................... G01R 1/06; G01R 31/02
[52] U.S. Cl. ................................ 324/158 P; 324/72.5; 324/158 F
[58] Field of Search ............... 324/158 P, 72.5, 158 F, 324/73 PC; 211/60.1, 69, 69.1, 69.5, 69.8; 339/64 M, 64 R

[56] References Cited

U.S. PATENT DOCUMENTS

| 545,497 | 9/1895 | Hayden | 211/69.8 |
| 710,293 | 9/1902 | McClung | 211/69.8 |
| 2,960,263 | 11/1960 | Goddard | 211/60.1 |

FOREIGN PATENT DOCUMENTS

| 657903 | 5/1929 | France | 339/64 M |
| 271732 | 6/1927 | United Kingdom | 211/69 |

Primary Examiner—Ernest F. Karlsen
Attorney, Agent, or Firm—Joseph J. O'Keefe

[57] ABSTRACT

An electrical contact assembly for use as a component of an automated system for testing electronic devices, such as silicon chips. The contact assembly comprises a ring element, a plurality of spring loaded contact probes, an elastic retaining band and alignment pins. The ring element has a plurality of holes that extend through the element from the top to the bottom surfaces, and a groove that encircles the ring element, extending inwardly from its outer peripheral surface, and connects through a small window with each hole. A spring loaded contact probe is positioned in each hole and has a small portion of its surface projecting into the groove through the window associated with each hole. An elastic retaining band is placed in the groove, and partially grasps a portion of the surface of each spring-loaded contact probe, where the surface thereof projects into the groove. Thus, the retaining band maintains each contact probe in position in the ring element, while permitting the contact probe to move in either direction without undue interference. The alignment pins extend outwardly from the bottom surface of the ring element to assist in positioning the contact assembly in an automated testing system.

4 Claims, 5 Drawing Figures

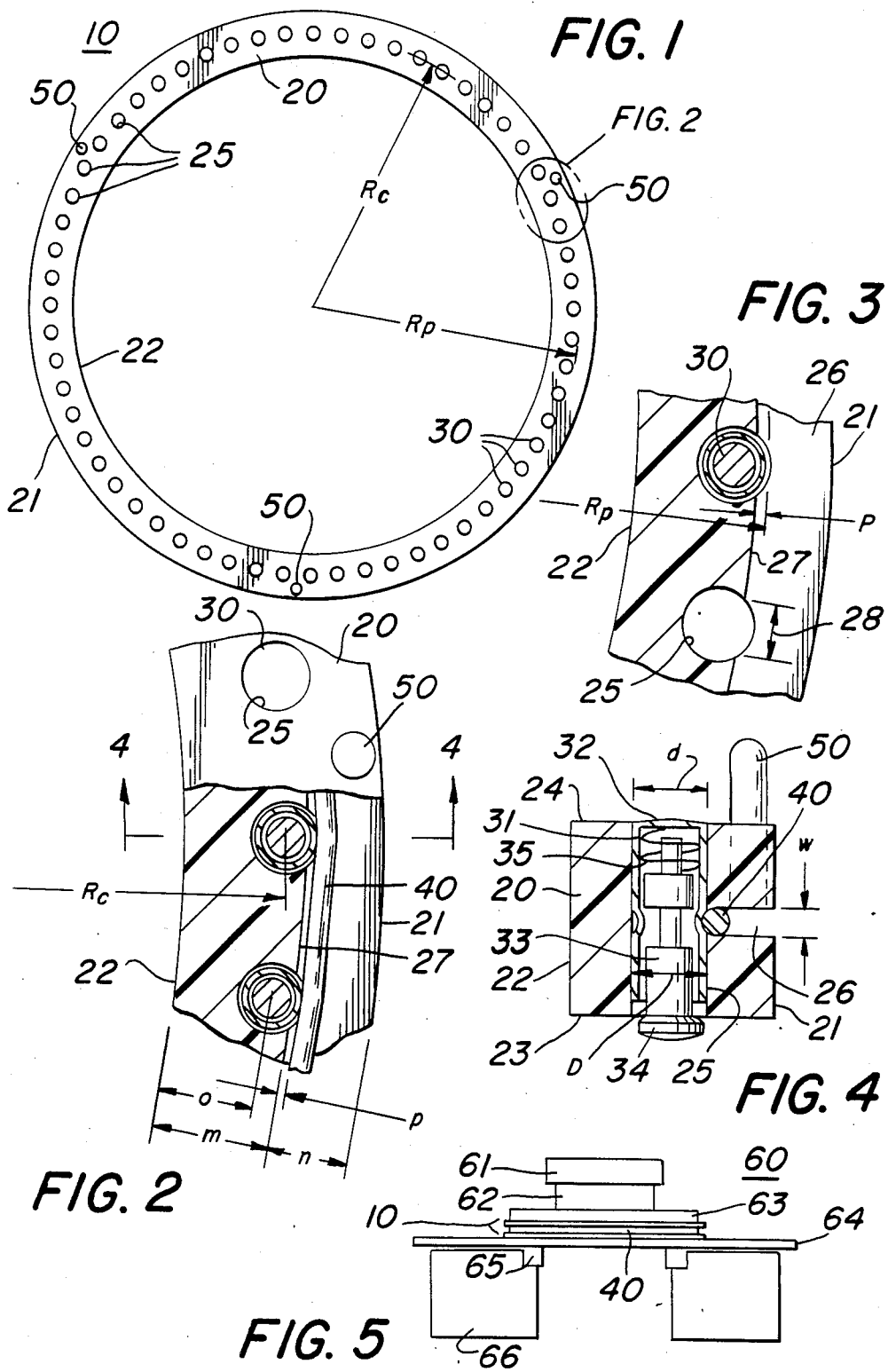

ELECTRICAL CONTACT ASSEMBLY

BACKGROUND OF THE INVENTION

This invention relates to automated testing of electronic devices, such as silicon chips, electrical circuits, and electrical systems, and, more particularly, to an improved electrical contact assembly for use in conjunction with such testing.

In order to successfully manufacture and market high quality and price-competitive electronic devices, for example, silicon chips, they must be tested to insure that they meet rigid performance specifications. In the past electronic devices were complicated, difficult and expensive to manufacture, and testing was generally done manually, a time consuming procedure that contributed to the high cost of such devices. However, in time, the design and manufacturing procedures were improved, prices declined and demand surged. To keep pace with the improved manufacturing operations, improved testing practices had to be developed, both to automate the testing and to reduce the time for testing. Now that some such electronic devices are being mass produced and sold by the millions, the testing procedures and practices have become very sophisticated, and the automated testing equipment has grown more complex and expensive. For example, the cost of test equipment for some mass produced electronic devices may range from $200,000 to $2,000,000.

A typical automated system for testing the performance of silicon chips may include, for example, (1) a performance board which has a large number of printed circuits on its upper surface and connectors on its lower side, (2) electronic pin cards that engage with the lower connectors, (3) an electrical contact assembly, which has a plurality of contact areas, that is positioned on top of the printed circuits of the performance board, (4) a device under test board (D.O.T.) that rests on top of the contact assembly, (5) a socket on top of the device under test board, and (6) an electronic device to be tested that is plugged into the socket. Such test systems are well known to those skilled in the art and will be referred to hereinafter in greater detail.

Electrical contact assemblies, which are one of the components of a system for testing electronic devices, normally have 24, 60, 84, 120, or more or less, contact areas, pins, probes or lines, generally arranged in a pattern. Electrical contact assemblies have been made with spring loaded contacts, compressible metallic conductive materials, compressible conductive rubber (elastomer) and other structures. However, all such prior assemblies have a number of deficiencies.

Present spring loaded contact assemblies are expensive because of the housings required to contain them and the need for short low resistance and low inductance connections. Furthermore, it is difficult to maintain the spring loaded contacts in positions that permit them to operate freely in both directions without undue interference. Compressive metallic conductive materials were widely used for contact assemblies before the development of conductive rubber assemblies that provide a more economical and dependable circuit. Compressible conductive rubber materials are now widely used for contact assemblies because of their moderate cost and the ability of most test operators to quickly observe when such assemblies are defective. Also, replacement of defective compressible conductive rubber assemblies requires little time. However, conductive rubber assemblies are subject to short circuiting between adjacent lines whenever slight misalignment of test assemblies occurs. In addition, the rubber material sometimes is damaged and reduced in size due to wear, abrasion and abuse. As a result of repetitive compression and release, as well as normal shop abuse, the use of conductive rubber contributes to problems in electronic test systems. The problems with conductive rubber are further compounded by errors created by the resistance of rubber when measuring low voltage drops.

SUMMARY OF THE INVENTION

In view of the problems associated with prior art electrical contact assemblies used as components of automated testing equipment for electronic devices, it is an object of this invention to provide an electrical contact assembly of improved design, reduced overall cost and improved operation.

It is an object of this invention to provide an electrical contact assembly designed to utilize spring loaded contact probe and retain them in operable position within the assembly so that the contact probes can effectively operate in both directions without undue interference.

It is a further object of this invention to provide an electrical contact assembly that makes use of a simple and inexpensive device to partially grasp a portion of each of the spring loaded contact probes of the assembly with sufficient force or frictional pressure to retain it in position, i.e. to keep the probe from falling out of the assembly, while permitting each contact to effectively operate in both directions without undue interference.

Briefly stated, these objects are attained by providing an electrical contact assembly which includes a ring-shaped element, a plurality of spring loaded contact probes and an elastic retaining band that partially grasps and positions each of the spring-loaded contact probes. The ring-shaped element has curved outer and inner peripheries and flat top and bottom faces. Spaced holes extend through the ring-shaped element, from the top to the bottom faces, and a slot extends around the ring element from the outer periphery inwardly to, and connects through an opening or window with, each of the spaced holes. A spring-loaded contact probe is placed in each hole, and a portion of each probe extends into the slot through the window associated with such hole. The elastic band is positioned in the slot of the ring-shaped element so as to partially grasp a portion of each of the spring loaded contact probes with sufficient frictional pressure to retain it in position, while permitting the probe to effectively operate in both directions without undue interference.

The above and other objects, features and advantages of the invention will be more fully understood by reference to the following description when considered in connection with the accompanying illustrative drawing.

DESCRIPTION OF THE DRAWING

In the drawing which illustrates the best mode presently contemplated for carrying out the present invention;

FIG. 1 is a plan view of the electrical contact assembly, bottom side up, as embodied in the present invention.

FIG. 2 is an enlarged illustrative fragmentary plan view, partly in section, of a portion of the electrical contact assembly as embodied in the present invention.

FIG. 3 is an enlarged fragmentary plan view, partly in section, of a portion of the electrical contact assembly as embodied in the present invention.

FIG. 4 is an enlarged sectional view taken along the line 4—4 of FIG. 2.

FIG. 5 is a cross-sectional sketch illustrating the electrical contact assembly embodied in the present invention as a component of an automated testing system.

DESCRIPTION OF THE PREFERRED EMBODIMENT

Referring to FIGS. 1 and 4, there is shown the electrical contact assembly 10 of the present invention. Assembly 10 includes ring element 20, a plurality of spring-loaded contact probes 30, elastic retaining band 40 and alignment pins 50, all arranged in a manner hereinafter described.

Ring element 20 has an outer peripheral surface 21, an inner peripheral surface 22, flat top surface 23 and flat bottom surface 24. A plurality of holes 25 extend through ring element 20, from top surface 23 to bottom surface 24. Holes 25 have a diameter D and are equally spaced with their centers on a circle, which has a radius RC and which is located approximately midway between outer peripheral surface 21 and inner peripheral surface 22. Extending inwardly from outer peripheral surface 21 of ring element 20, approximately midway between top surface 23 and bottom surface 24, is groove 26. Extending outwardly from the bottom surface 24 of element 20 are three alignment pins 50, located adjacent the outer peripheral surface 21 and spaced approximately 120 degrees apart. Alignment pins 50 extend partially through element 20 from bottom surface 24 to groove 26. Positioned in each hole 25 is a contact probe 30 that comprises a lower body section 31, which has diameter d and a lower contact end 32, a cylindrical upper section 33, which has an upper contact end 34 that is larger in diameter than diameter D of hole 25, and spring 35. The diameter d of the lower body section 31 of contact probe 30 is slightly smaller, about 0.001 inch, than the diameter D of hole 25, so that each probe 30 slides neatly, without binding, into position within its respective hole 25. The contact probe spring 35 of such probe can operate against both the lower body section 31 and the upper section 33, without binding or undue interference.

As best shown in FIG. 4, the normal expanded length of each contact probe 30 extends from the top side of upper contact end 34 to the outside tip of lower contact end 32. This length is greater than the thickness of ring element 20. In operation, contact probe 30 can be compressed by placing pressure against contact end 32.

As best shown in FIG. 2, and in FIG. 4, groove 26 has bottom 27 and width w. The distance from inner peripheral surface 22 of element 20 to the groove bottom 27 is m, and the distance from groove bottom 27 to outer peripheral surface 21 is n. The distance from inner peripheral surface 22 to the circle of radius Rc, on which are located the centers of holes 25, is o. The distance o plus the radius of hole 25, i.e. $\frac{1}{2}$ D, is greater than the distance m from the inner peripheral surface 22 of element 20 to the bottom 27 of groove 26. As a result each hole 25 connects with groove 26 through an opening or window 28, as shown in FIG. 3, which for illustrative purposes does not include one contact probe 30 or elastic retaining band 40. Consequently, a small portion of the surface of each spring-loaded contact probe 30 that is inserted into a hole 25 projects through the window 28 of such hole and into groove 26 a distance p, as shown in FIG. 3, that is equal to about $\frac{1}{8}$ D. A circle drawn tangentially of holes 25, at their outer faces has a radius $R_p$.

Retaining band 40, an O-ring, is made from round elastic material having a cross-sectional diameter, slightly less than width w of groove 26. As shown in FIG. 4, when band 40 is stretched around the outer peripheral surface 21 of ring element 20, and moved to groove 26, band 40 because of its elasticity and slightly smaller cross-sectional diameter, will easily slip into groove 26. Band 40, under tension, will partially grasp a portion of the surface of each contact probe 30 where it projects into groove 26 through the window 28 of each such contact probe's respective hole 25. As shown in FIG. 2, because a small portion of the surface of each spring-loaded contact probe 30 that is inserted into a hole 25 projects through window 28 of such hole and into groove 26 a distance p and since retaining band 40 stretches between each probe and tangentially grasps a portion of the surface of each probe, band 40 does not touch the bottom 27 of groove 26. By virtue of band 40, under tension, tangentially grasping a portion of the surface of each contact probe 30, each such probe is retained in position in its respective hole 25, i.e. is restrained from falling, even when ring element 20 is positioned with its top surface 23 facing downwardly. The grasping creates sufficient frictional pressure against each contact probe 30 to retain it in its respective hole 25, while permitting the contact probe spring 35 to exert pressure, without interference, against both the lower body section 31 and the upper section 33, as required.

As shown in FIG. 5, contact assembly 10 is a component of an automated testing system 60. As is known to those skilled in the art, system 60 may include a device under test 61, such as a silicon chip, a socket 62, a device under test board (D.U.T.) 63, the contact assembly 10 of this invention, a performance board 64, which has a plurality of printed circuits, contact connectors 65 and pin electronic cards 66. Typically, a pin electronic card will be assigned to one or two test lines on the test system and either provide a test line with appropriate signals or measure the electrical conditions at that line. Each socket 62 is, by this manner, assigned to a pin electronics card and test line as desired.

An example of the specific embodiment of the invention described is an electrical contact assembly 10 with a ring element 20 made of Teflon, having an outside diameter of 4.010 inches, an inside diameter of 3.375 inches and a thickness of 0.323 inches. Element 20 has a groove 26 which is about 0.060 inches wide and extends 0.162 inches into the element. Element 20 has sixty holes 25, each with a diameter of 0.063 inches, drilled on a circle having a radius Rc of 1.843 inches, to receive spring contact probes 30 having a diameter of 0.054 inches, such as SS-3 short stroke spring contact probes manufactured by Interconnect Devices, Inc. of Kansas City, Kansas. Retaining band 40 is an elastic O-ring which, in its natural state, has a diameter of 2.579 inches. The material of the O-ring has a diameter of 0.059 inches.

While holes 25 in the figures are shown perpendicular to the top surfaces 23 of element 20, such holes may be placed at a slight angle to the perpendicular. At such an angle the spring-loaded contact probes 30 will tend to move slightly when electrical contact element 10 is positioned in an automated testing assembly. This movement will cause the ends 32 and 34 of such contact elements to scrape or wipe the surface of an abutting contact board, clean the contact areas and also supply a side thrust inside contact probe 30, improving its internal electrical contact.

While this invention has been described with respect to certain embodiments, it will be apparent to those skilled in the art that various modifications, alterations and improvements may be made without departing from the spirit of the invention. For example, groove 26 may be on the top surface 23 or bottom surface 24 rather than extending inwardly from outer periphery 21 and holes 30 need not be arranged in a circle. Accordingly, it is to be understood that the invention is not to be limited by the specific illustrative embodiment, but only by the scope of the appended claims.

We claim:

1. A contact assembly for use between test means of an electronic testing system, comprising:
   (A) a holding element having:
      (1) a plurality of holes extending from a first surface to a second surface thereof;
      (2) a groove in said element connecting with each said hole;
   (B) a plurality of compressible contact probe means, each comprising:
      (1) a first body section,
      (2) a second body section, and
      (3) spring means operating against said second body sections to expand said probe to a normal length greater than the thickness of said holding element between said first and second surfaces;
      and designed and constructed to extend through one of said holes and have a portion of said probe means project into said groove;
   (C) a retaining band designed and constructed to fit into said groove of said holding element and partially grasp each said contact probe means portion projecting into said groove, whereby each said contact probe means is retained from falling out of said holding element while effectively functioning in both directions without undue interference and, when placed between said testing means of said electronic testing system, compressed by pressure placed against the end of a body section of said probe means when said holding element is placed between said testing means of said electronic testing system.

2. The contact assembly of claim 1, wherein said holding element has an outer peripheral surface and said groove extends into said holding element from the outer peripheral surface thereof.

3. The contact assembly of claim 1, wherein said retaining band tangentially grasps a plurality of said contact probe means and extends therebetween out of contact with the bottom of said holding element groove.

4. A contact assembly for use between test means of an electronic testing system comprising:
   (A) a holding element having:
      (1) a top surface,
      (2) a bottom surface,
      (3) a plurality of holes extending through said element from said top surface to said bottom surface,
      (4) an outer peripheral surface,
      (5) a groove extending into said element from said outer peripheral surface and connecting through an opening in said groove with each said hole;
   (B) a plurality of compressible contact probe means, each comprising:
      (1) a first body section,
      (2) a second body section, and
      (3) spring means operating against said first and said second body sections to expand said probe to a normal length greater than the thickness of said holding element between said top surface and said bottom surface,
      and designed and constructed to extend through one of said element holes and have a portion of said probe means extend into said groove through the groove opening associated with said hole;
   (C) a retaining band designed and constructed to fit into said holding element groove and partially grasp each said contact probe means portion extending into said groove with sufficient frictional pressure to retain said probe means from falling out of said holding element and permit said probe means to operate effectively in both directions without undue interference and be compressed by pressure placed against the end of a body section of said probe means, when said holding element is placed between said testing means of said electronic testing system.

* * * * *